United States Patent
Kim et al.

(10) Patent No.: US 9,207,403 B2
(45) Date of Patent: Dec. 8, 2015

(54) TOTAL REFLECTION TYPE OPTICAL SWITCH USING POLYMER INSERTION TYPE SILICA OPTICAL WAVEGUIDE AND MANUFACTURING METHOD THEREOF

(75) Inventors: Young Sic Kim, Gwangju (KR); Jang-Uk Shin, Daejeon (KR); Hyung-Myung Moon, Gwangju (KR); Jin-Bong Kim, Gwanju (KR)

(73) Assignee: Photonics Planar Integration Technology, Inc., Gwangju (KR)

( * ) Notice: Subject to any disclaimer, the term of this patent is extended or adjusted under 35 U.S.C. 154(b) by 280 days.

(21) Appl. No.: 13/882,620

(22) PCT Filed: Oct. 25, 2011

(86) PCT No.: PCT/KR2011/007971
§ 371 (c)(1),
(2), (4) Date: Apr. 30, 2013

(87) PCT Pub. No.: WO2012/060567
PCT Pub. Date: May 10, 2012

(65) Prior Publication Data
US 2013/0223793 A1    Aug. 29, 2013

(30) Foreign Application Priority Data
Nov. 2, 2010   (KR) .......................... 10-2010-0108358

(51) Int. Cl.
*G02B 6/35* (2006.01)
*G02F 1/295* (2006.01)
(Continued)

(52) U.S. Cl.
CPC ................ *G02B 6/35* (2013.01); *G02B 6/3596* (2013.01); *G02F 1/0147* (2013.01); *G02F 1/315* (2013.01);
(Continued)

(58) Field of Classification Search
CPC ..... G02F 1/315; G02F 1/3137; G02F 1/3138; G02B 6/35
See application file for complete search history.

(56) References Cited

U.S. PATENT DOCUMENTS 4,753,505 A * 6/1988 Mikami et al. ..................... 385/5
5,577,141 A * 11/1996 Adar et al. ....................... 385/43
(Continued)

FOREIGN PATENT DOCUMENTS

JP  2004-325601 A  11/2004
KR  10-2000-0014362 A  3/2000
(Continued)

OTHER PUBLICATIONS

International Search Report in International Application No. PCT/KR2011/007971, filed Oct. 25, 2011.

*Primary Examiner* — Michelle R Connelly
(74) *Attorney, Agent, or Firm* — Saliwanchik, Lloyd & Eisenschenk (57) ABSTRACT

The present invention relates to a total reflection type optical switch using polymer insertion type silica optical waveguides and a manufacturing method thereof. The total reflection type optical switch forms a trench in an intersecting point of the silica optical waveguides having two optic routes, and inserts a polymer into the trench. A total reflection type optical switch has a heater which heats the polymer. The polymer is made of thermo-optic material, and totally reflects an optical signal as a refraction index falls when heated by the heater. In addition, when not heated by the heater, the polymer transilluminates the optical signal. When the polymer is made of electric-optic material, the total reflection type optical switch may have upper and lower electrodes for applying an electric field in the polymer instead of the heater. In this case, the total reflection type optical switch is capable of high speed switching, and is not limited to usages of an optical switch, and may be used as a variable optical attenuator by adjusting the voltage and current being applied. According to the present invention, it is possible to use the difference of the refraction indexes of the silica optical waveguides and the polymer due to temperature changes to transilluminate or totally reflect an optical signal according to changes of the refraction index of the polymer, thereby improving loss characteristics of the optical signal.

20 Claims, 11 Drawing Sheets

(51) Int. Cl.
     *G02F 1/313*    (2006.01)
     *G02F 1/315*    (2006.01)
     *G02F 1/01*     (2006.01)
     *H01L 21/02*    (2006.01)
     *G02F 1/015*    (2006.01)

(52) U.S. Cl.
     CPC ............ G02F 1/3137 (2013.01); G02F 1/3138 (2013.01); H01L 21/02 (2013.01); *G02B 6/3522* (2013.01); *G02B 6/3548* (2013.01); *G02B 6/3576* (2013.01); *G02F 2001/0154* (2013.01)

(56) References Cited

U.S. PATENT DOCUMENTS

| | | | |
|---|---|---|---|
| 6,356,679 B1 * | 3/2002 | Kapany | 385/18 |
| 6,449,404 B1 * | 9/2002 | Paiam | 385/16 |
| 6,934,446 B2 * | 8/2005 | Rasras | 385/39 |
| 7,151,868 B1 * | 12/2006 | Wang | 385/16 |
| 7,203,411 B1 * | 4/2007 | Jiang et al. | 385/140 |
| 2002/0034352 A1 * | 3/2002 | Williams et al. | 385/16 |
| 2002/0176652 A1 * | 11/2002 | Mitomi et al. | 385/16 |
| 2003/0048975 A1 * | 3/2003 | Lackritz et al. | 385/14 |
| 2003/0072048 A1 * | 4/2003 | Hoekstra | 359/109 |
| 2004/0264845 A1 * | 12/2004 | Li | 385/18 |
| 2006/0023989 A1 * | 2/2006 | Yanagisawa et al. | 385/14 |
| 2007/0081763 A1 * | 4/2007 | Wang | 385/18 |
| 2008/0286580 A1 * | 11/2008 | Petrucci-Samija et al. | 428/422 |
| 2008/0292240 A1 * | 11/2008 | Maki | 385/17 |
| 2009/0263068 A1 * | 10/2009 | Nayyer | 385/9 |
| 2012/0020614 A1 * | 1/2012 | Han et al. | 385/17 |
| 2013/0223793 A1 * | 8/2013 | Kim et al. | 385/18 |

FOREIGN PATENT DOCUMENTS

| | | |
|---|---|---|
| KR | 10-0686920 B1 | 2/2007 |
| KR | 10-0970927 B1 | 7/2010 |

* cited by examiner

| Polymer RI | Reflective port | Pass Main port |
|---|---|---|
| 1.4500 | 0.000021 | 0.924435 |
| 1.4475 | 0.001079 | 0.906494 |
| 1.4450 | 0.007653 | 0.816737 |
| 1.4425 | 0.031877 | 0.574516 |
| 1.4400 | 0.112847 | 0.247171 |
| 1.4375 | 0.331144 | 0.049919 |
| 1.4350 | 0.659828 | 0.002124 |
| 1.4325 | 0.860299 | 0.000114 |
| 1.4300 | 0.935022 | 0.000003 |
| 1.4275 | 0.954855 | 0.000000 |
| 1.4250 | 0.959036 | 0.000000 |
| 1.4225 | 0.963587 | 0.000000 |

| Polymer R.I | Reflective port | Pass port |
|---|---|---|
| 1.45000 | 0.0000316 | 0.9364576 |
| 1.44875 | 0.0001212 | 0.9435025 |
| 1.44750 | 0.0007986 | 0.9410614 |
| 1.44625 | 0.0024163 | 0.9176816 |
| 1.44500 | 0.0056407 | 0.8865124 |
| 1.44375 | 0.0109828 | 0.8302581 |
| 1.44250 | 0.0181097 | 0.7437590 |
| 1.44125 | 0.0338366 | 0.6234405 |
| 1.44000 | 0.0574941 | 0.4775700 |
| 1.43875 | 0.0927535 | 0.3251180 |
| 1.43750 | 0.1625384 | 0.1863547 |
| 1.43625 | 0.2587288 | 0.0855094 |
| 1.43500 | 0.3969685 | 0.0315462 |
| 1.43375 | 0.5620145 | 0.0103211 |
| 1.43250 | 0.6928982 | 0.0030569 |
| 1.43125 | 0.8068131 | 0.0003405 |
| 1.43000 | 0.8766404 | 0.0001239 |
| 1.42875 | 0.9148936 | 0.0000247 |
| 1.42750 | 0.9365655 | 0.0000031 |
| 1.42625 | 0.9551103 | 0.0000008 |
| 1.42500 | 0.9598162 | 0.0000002 |
| 1.42375 | 0.9625202 | 0.0000001 |

FIG. 16

TOTAL REFLECTION TYPE OPTICAL SWITCH USING POLYMER INSERTION TYPE SILICA OPTICAL WAVEGUIDE AND MANUFACTURING METHOD THEREOF

CROSS-REFERENCE TO RELATED APPLICATIONS

This application is the U.S. national stage application of International Patent Application No. PCT/KR2011/007971, filed Oct. 25, 2011, which claims priority to Korean Application No. 10-2010-0108358, filed Nov. 2, 2010, the disclosures of each of which are incorporated herein by reference in their entirety.

BACKGROUND

1. Field

The following description relates to an optical switch, and more particularly, to a total reflection type optical switch using polymer insertion type silica optical waveguide and a manufacturing method thereof.

2. Description of Related Art

For an optical device used in an optical communications network system, a Planar Lightwave Circuit (PLC) device is generally used.

One of the main characteristics of a planar lightwave circuit (PLC) device is that it could be integrated together with selectable functions such as the transmitting and accessing function, rooting, switching, attenuating and programmable filtering etc.

Such a planar lightwave circuit (PLC) device uses silicon dioxide ($SiO_2$), so called silica, for optical waveguides to have excellent loss characteristics.

A general polymer total reflection type optical switch installs a heater in a central part of optical waveguides intersecting one another. The heater heats a part of the optical waveguides. Due to the changes in temperature of the optical waveguides, refraction indexes of optical waveguide material change as well, causing the total reflection phenomenon.

DETAILED DESCRIPTION OF THE INVENTION

Technical Task

However, a silica optical waveguide has a positive thermo-optic coefficient value. In a silica optical waveguide, changes in a refraction index caused by a heater occurs in a positive direction. Thus, it is difficult for a total reflection phenomenon to occur.

In addition, the silica optical waveguide has an extremely low thermo-optic coefficient, and thus there is little change in the refraction indexes. Therefore, it is almost impossible to manufacture a total reflection type optical switch using silica optical waveguides.

Furthermore, in an optical matrix switch which uses a plurality of total reflection type optical switches, the structure and characteristics of an optical switch is very important.

The purpose of the present invention is to provide an optical switch with excellent total reflection characteristics and a manufacturing method thereof.

Another purpose of the present invention is to provide a total reflection type optical switch which uses polymer insertion type silica optical waveguides and a manufacturing method thereof.

Another purpose of the present invention is to provide a total reflection type optical switch which could be used as a variable optical attenuator and a manufacturing method thereof.

Means to Solve the Tasks

A total reflection type optical switch of the present invention with the purpose to solve the aforementioned purposes is characterized to insert a polymer in a position where silica optical waveguides with different optical routes intersect one other. Such a total reflection type optical switch may improve total reflection characteristics in response to changes of refraction indexes of the polymer.

A total reflection type optical switch of the present invention according the aforementioned characteristics includes a substrate; silica optical waveguides which are formed on the substrate and intersect one another so as to have different optical routes; and a switching member which is inserted such that a cross section of the silica optical waveguide is penetrated up and down in a location where the silica optical waveguides intersect one another, and switches so as to change the optical route of an optical signal input into the silica optical waveguides.

In an exemplary embodiment, the total reflection type optical switch further includes a heater which heats the switching member. Herein, the switching member has a thermo-optic polymer which transilluminates the optical signal when it is not heated by the heater whereas which totally reflects the optical signal as the refraction index falls when heated by the heater.

In another exemplary embodiment, the total reflection type optical switch further includes upper and lower electrodes which are installed in both upper and lower sides of the switching member, and which receive power and form an electric field in the switching member. Herein, the switching member has an electric optical polymer which transilluminates the optical signal when an electric field is not formed and which totally reflects the optical signal as the refraction index falls when the electric field is formed.

In another exemplary embodiment, the total reflection type optical switch may be used as an variable optical attenuator which adjusts power applied to the heater or the upper and lower electrodes so as to adjust an intensity of the optical signal.

In another exemplary embodiment, a lower surface of the switching member is located between the substrate and the silica optical waveguides.

In another exemplary embodiment, the switching member has a negative thermo-optic coefficient value, and is made of material with the same refraction index as the silica optical waveguides.

According to another aspect of the present invention, a heater type total reflection type 1×2 optical switch is provided. Such a total reflection type optical switch of the present invention switches the optical signal using thermo-optic polymer.

The total reflection type optical switch includes a first silica optical waveguide which has a first silica optical waveguide which is formed on a substrate and connects an input port with a first output port, and a second silica optical waveguide which intersects the first silica optical waveguide and is connected to the second output port; a thermo-optic polymer which is provided in a location where the first and the second silica optical waveguides intersect one another, and switches the optical signal input to the input port to the first silica optical waveguide or the second silica optical waveguide; and a heater which heats the thermo-optic polymer. Herein, the thermo-optic polymer transilluminates the optical signal to the first output port by the heater or totally reflects the optical signal to the second output port.

In one exemplary embodiment, the total reflection type optical switch may be used as an optical variable attenuator which adjusts power applied to the heater to adjust an intensity of the optical signal.

In another exemplary embodiment, the silica optical waveguide further includes a plurality of third silica optical waveguides which divaricate perpendicularly in the longitudinal direction of the thermo-optic polymer or the electric optic polymer and between which a certain distance is maintained.

In another exemplary embodiment, the third silica optical waveguides are arranged in the direction of the input port and the output port around the location where they intersect one another, forming a symmetric structure.

In another exemplary embodiment, the third silica optical waveguides are provided in such a manner that the width thereof decreases as it gets closer to the input port and output port based on the location where the silica optical waveguides intersect one another.

According to another aspect of the present invention, an electric field type total reflection type 1×2 optic switch is provided. Such a total reflection type optic switch of the present invention may switch the optical signal at a high speed using the electric optic polymer.

The total reflection type optic switch according to this aspect includes a silica optical waveguide which has a first silica optical waveguide which is formed on a substrate and connects an input port with a first output port, and a second silica optical waveguide which intersects the first silica optical waveguide and is connected to the second output port; an electric optic polymer which is provided in a location where the first and the second silica optical waveguides intersect each other, and which switches the optical signal input such that the optical signal input to the input port is output to the first silica optical waveguide or the second silica optical waveguide; and upper and lower electrodes which are installed in both upper and lower sides of the electric optic polymer, and which receives power and forms an electric field in the electric optic polymer. Herein, the electric optic polymer transilluminates the optical signal to the first output port when an electric field is not formed, and totally reflects the optical signal to the second output port as the refraction index falls when an electric field is formed.

In one exemplary embodiment, the total reflection type optical switch may be used as an optical variable attenuator which adjusts power applied to the upper and lower electrodes to adjust the intensity of the optical signal.

In another exemplary embodiment, the silica optical waveguide further includes a plurality of third silica optical waveguides which divaricate perpendicularly in the longitudinal direction of the thermo-optic polymer or the electric optic polymer and between which a certain distance is maintained.

In another exemplary embodiment, the third silica optical waveguides are arranged in the direction of the input port and the output port around the location where they intersect one another, forming a symmetric structure.

In another exemplary embodiment, the third silica optical waveguides are provided in such a manner that the width thereof decreases as it gets closer to the input port and output port based on the location where the silica optical waveguides intersect one another.

According to another aspect of the present invention, a method for manufacturing a total reflection type optical switch using polymer insertion type silica optical waveguide is provided. According to this method, a general silica optical waveguide manufacturing process of an PLC device is performed, a trench is formed, and a polymer is inserted into the trench.

The method of manufacturing a total reflection type optic switch according to the present aspect deposits a lower clad on the silica substrate. A silica core intersecting to have different optical routes is formed on the lower clad. An upper clad is deposited on the lower clad where the silica core is formed. A trench is formed from the upper clad to perpendicularly penetrate the silica core such that the bottom surface is located between the substrate and the silica core. Next, a polymer is inserted into the trench.

In one exemplary embodiment, the method further includes a step of forming a heater in an upper part of the polymer. Herein, the polymer is made of a thermo-optic polymer material which switches the optical signal input into the silica core by the heater.

In another exemplary embodiment, the method further includes a step of forming a lower electrode before the lower clad is deposited on the silica substrate, and forming an upper electrode in an upper part of the polymer. Herein, the polymer is made of electric optic polymer material which totally reflects the optical signal input into the silica core by the upper and lower electrodes In another exemplary embodiment, the step of forming the silica core forms first silica cores which form a first optic route, second silica cores which intersect the first silica cores and form a second optic rout, and third silica cores which divaricate generally perpendicularly in the longitudinal direction of the polymer or the electric optic polymer, are arranged to be distanced from one another in both sides around the intersection where the first and second silica cores intersect each other, and that the width thereof decreases as it gets closer to both sides from the intersection.

In another exemplary embodiment, the polymer has a negative thermo-optic coefficient value, and the same refraction index as the silica core.

Effects of the Invention

As aforementioned, in a total reflection type optical switch of the present invention, a polymer is inserted into a location where silica optical waveguides intersect one another. Accordingly, it is possible to convert a route of an optical signal by changing a refraction index of the polymer caused by a heater or an electric field. Such a total reflection type optical-switch of the present invention has excellent loss and reproducibility, and advantages of miniaturized size, low loss, less power consumption, and high speed operation.

In addition, the total reflection type optical switch of the present invention uses a substrate of a silica material. Accordingly, the total reflection type optical switch of the present invention may embody optical devices of various usages such as for example in the case of a planar manual device, wavelength multiplexer, and optical distributor etc.

Especially, the total reflection type optical switch of the present invention uses a thermo-optic or electric-optic polymer. Accordingly, the total reflection type optical switch of the present invention may be used as an optical variable attenuator by adjusting power (current or voltage) applied to the thermo-optic or electrical optic polymer.

6. FORMS FOR EMBODIMENT OF THE INVENTION

Exemplary embodiments of the present invention may be changed in various forms. The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increase clarity and conciseness.

Hereinbelow, exemplary embodiments of the present invention are explained in detail with reference to FIGS. 1 to 11.

Figure 1:
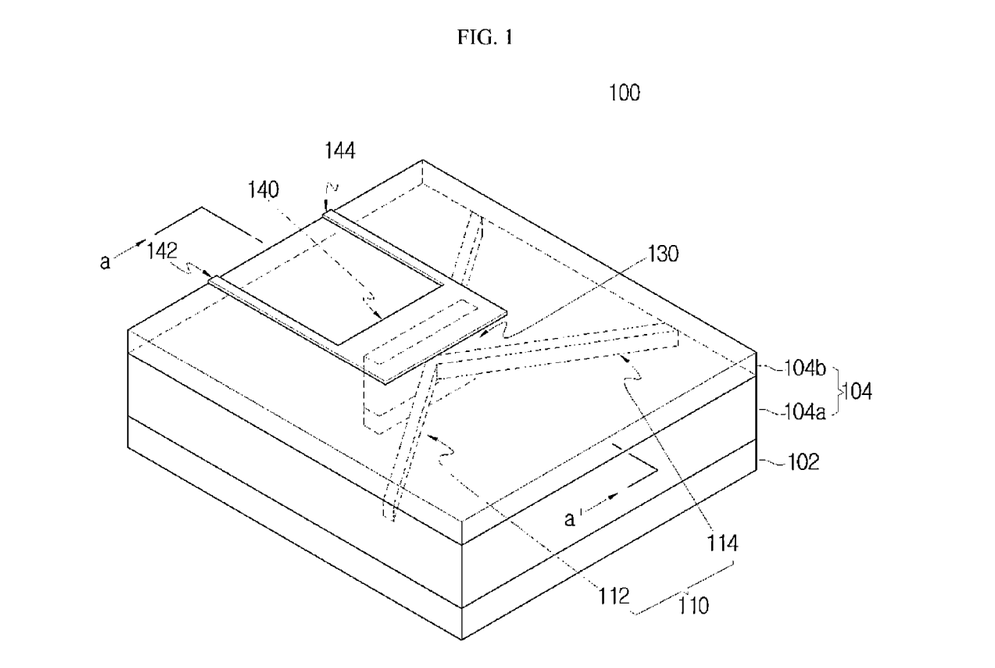
FIG. 1 is a perspective view illustrating a configuration of a total reflection type optical switch according to the present invention.
Figure 2:
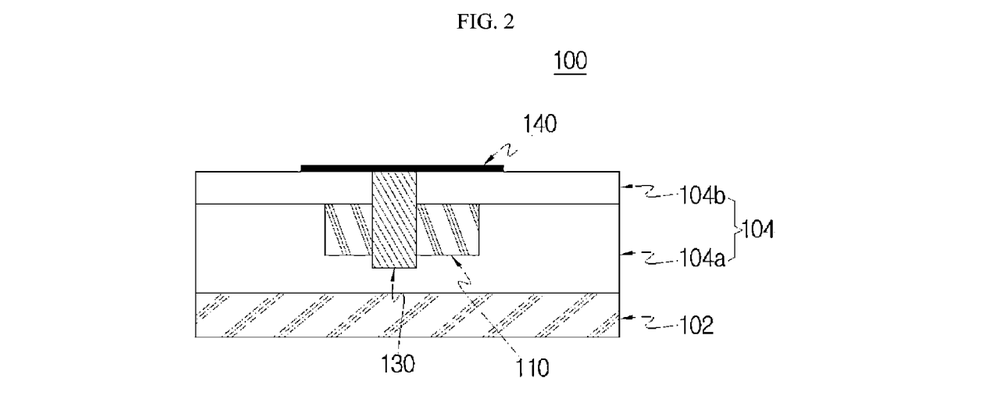
FIGS. 2 and 3 are cross-sectional views illustrating a configuration of a total reflection type optical switch illustrated in FIG. 1.
Figure 3:
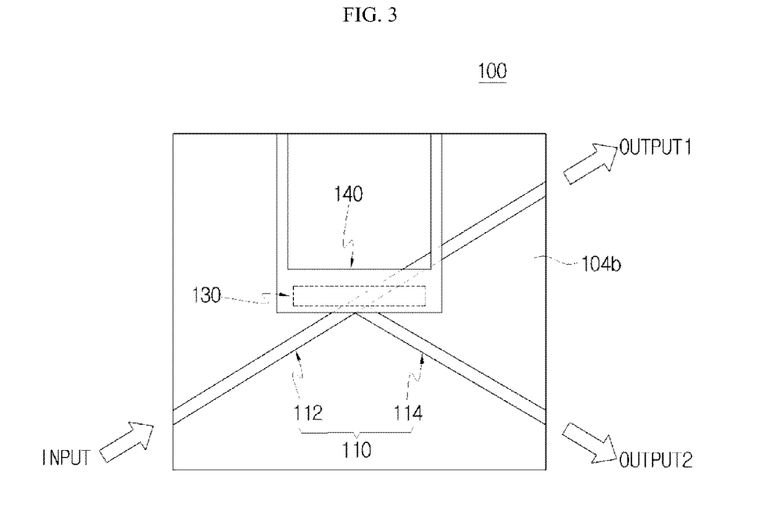

FIG. 1 is a perspective view illustrating a configuration of a total reflection type optical switch according to the present invention, and FIGS. 2 and 3 are views illustrating a configuration of a total reflection type optical switch illustrated in FIG. 1.

With reference to FIGS. 1 to 3, the total reflection type optical switch of the present invention 100 inserts a polymer 130 into a location where silica optical waveguides 110 intersect one another, in order to improve total reflection characteristics. There is provided a heater 140 in an upper part of the polymer 130. The polymer 130 switches an optical route by the heater 140. The total reflection type optical switch 100 is manufactured as a single mode optical device having similar cross section area size and refraction index with optic fiber.

Meanwhile, the total reflection type optical switch 100 may be manufactured as an optical device appropriate to a multi mode by expanding the width of the intersection part of the silica optical waveguides 110.

More specifically, the total reflection type optical switch 100 includes a silica substrate 102, a lower and upper clad 104: 104a, 104b, silica optical waveguides 110:112, 114, and a polymer 130 and heater 140.

The silica optical waveguide 110 is a silica core. The silica optical waveguide 110 is formed on a silica substrate 120. The overall surrounding area of the silica optical waveguide 110 is surrounded by a silica clad 104. The silica optical waveguide 110 is provided in a Y format where two different optical waveguides 112, 114 intersect each other. In the location (intersection) where the silica optical waveguides 110 intersect each other, a polymer 130 is inserted such that a cross section of the silica optical waveguide 110 is penetrated up and down. The silica optical waveguide 110 has a cross section size of a single mode or multi mode. For example, in a case where the silica optical waveguide 110 is a single mode, it has a width of approximately 5~10 μm. In a case where the silica optical waveguide 110 is a multi mode, it has a width of approximately 20~60 μm. In addition, it is possible to adjust the width of the silica optical waveguide in consideration of the difference of refraction index with the silica clad 104.

Optic routes 112, 114 includes a first optic route 112 which transmits an optical signal from an input port (Input of FIG. 3) to a first output port (OUTPUT1), and a second optic route 114 which intersects the first optic route 112 and transmit an optical signal to a second output port (OUTPUT2).

The polymer 130 is provided as a switching member which converts an optical route of an optical signal input into the silica optical waveguide 110. The polymer 130 generally has a rectangular shape, for an exact switching operation at the intersection of the silica optical waveguide 110. The polymer 130 is inserted under the condition capable of totally reflecting the optical signal input at the silica optical waveguide 110 (for example, refraction index etc.). To this end, after completion of the manufacturing process by a typical silica optical waveguide using the silica substrate 102, the total reflection type optical switch 100 forms a trench (132 of FIG. 11B). Herein, a bottom surface 132a of the trench 132 is located between the silica optical waveguide 110 and the silica substrate 102, as illustrated in FIG. 2.

The polymer 130 is arranged between the first and second optic routes 112, 114 of the silica optical waveguide 110 in an angle where total reflection is possible. In addition, the polymer 130 is extended longitudinally from the output port in the direction of the input port so as to sufficiently cover the intersection of the silica optical waveguide 110.

The polymer 130 has the same refraction index as the silica optical waveguide 110. The polymer 130 has a different refraction index as the silica clad 104. The polymer 130 is made of material with a big negative thermo-optic coefficient. Therefore, a refraction index of the polymer 130 is determined according to the difference of refraction indexes of the silica optical waveguide (silica core) 110 and the silica clad 104. For example, the refraction index of the polymer 130 is determined by calculating the refraction index of the temperature usable than the refraction index of the silica clad 104. The polymer 130 has an advantage of fast response speed and low consumption power.

The polymer 130 is provided in a sufficient length in response to the length of the integrated optical device. The width of the polymer 130 is adjustable at around approximately 5~30 μm in consideration of the optical loss of the optical device. That is because, if the width is less than about 5 μm, it is difficult to form a trench, and if the width exceeds about 30 μm, it may affect the loss characteristics of the optical device.

In addition, the heater 140 is made of, for example, metal material. The heater 140 is provided in an upper part of the polymer 130. The heater 140 has a width and length sufficient enough to cover the intersection of the silica optical waveguide 110. That is, the size of the heater is determined in consideration of the upper area of the polymer 130. The heater 140 has a plurality of terminals 142, 144 where power is applied. The heater 140 heats the polymer 130 in response to the temperature range satisfying the conditions where total reflection of the polymer 130 is possible. When the polymer 130 is heated, the refraction index of the polymer 130 falls, thereby operating the total reflection type optical switch 100 at an on-state. When power is not supplied to the heater 140, that is, when the polymer 130 is not heated, total reflection does not occur in the polymer 130, thereby operating the total reflection type optical switch 100 at an off-state. When the total reflection optical switch 100 is at an off state, an optical signal input penetrates the polymer 130 and is transmitted to the first optic rout 112. When the total reflection type optical switch 100 is at an on state, the optical signal is totally reflected in the polymer 130 and is transmitted to the second optic rout 114.

Figure 4:
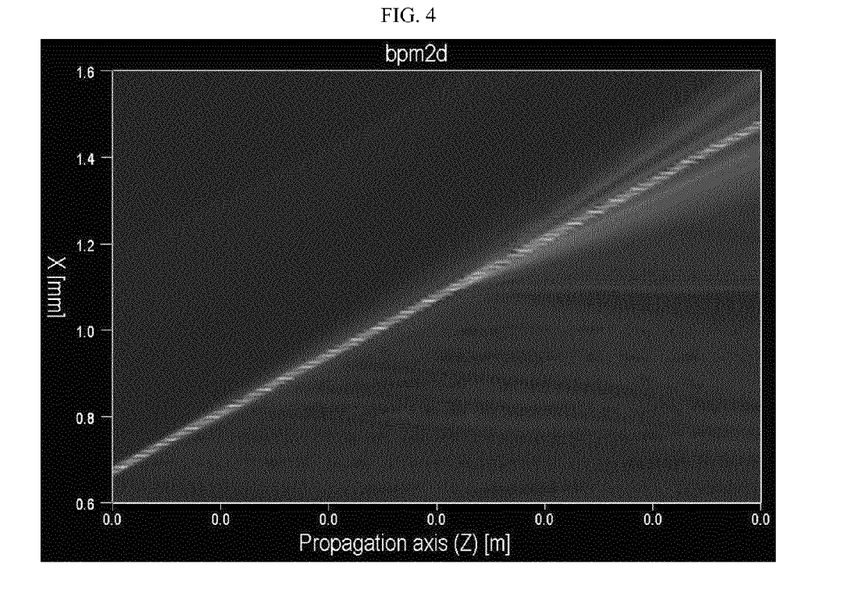
FIGS. 4 and 5 are views illustrating computer simulation results according to an operation state of a heater in a total reflection type optical switch illustrated in FIG. 1.
Figure 5:
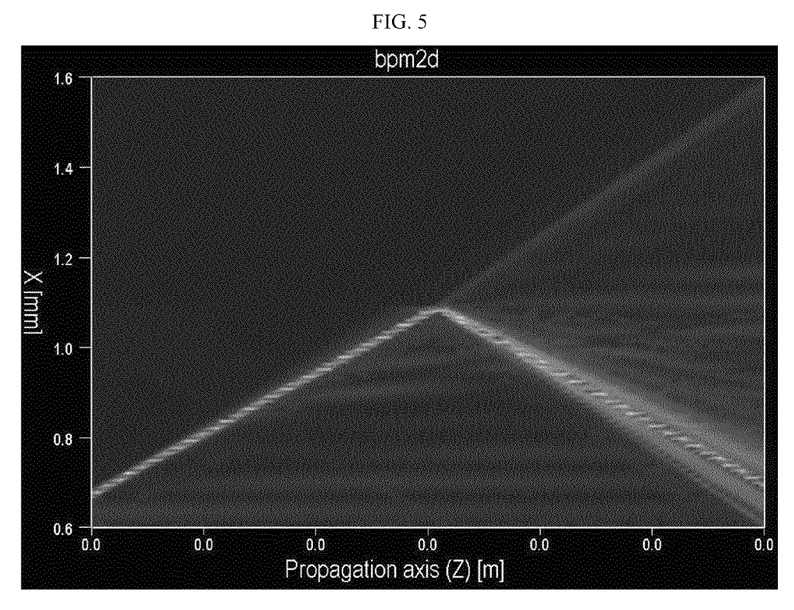

FIGS. 4 and 5 are views illustrating computer simulation results according to operations state of a heater in a total reflection type optical switch illustrated in FIG. 1.

With reference to FIGS. 4 and 5, this computer simulation result used the BPM (Beam Propation Method). FIGS. 4 and 5 show route changes in an optical signal proceeding from the left to right along the Z axis (Propagation axis). As illustrated in FIG. 4, at an off state where the heater 140 does not heat the polymer 130, the optical signal is transmitted to the first optic route 112. As illustrated in FIG. 5, at an on state where the heater 140 heated the polymer 130, the optical signal is totally reflected in the polymer 130 and is transmitted to the second optic route 114. Herein, due to the reasons of the computer simulation program used herein, the unit of the X axis is represented as mm, and the unit of the Z axis is represented as m. Therefore, in preparation to the mm scale of the X axis, the unit distances of the Z axis are all represented as 0.0.

Figure 6:
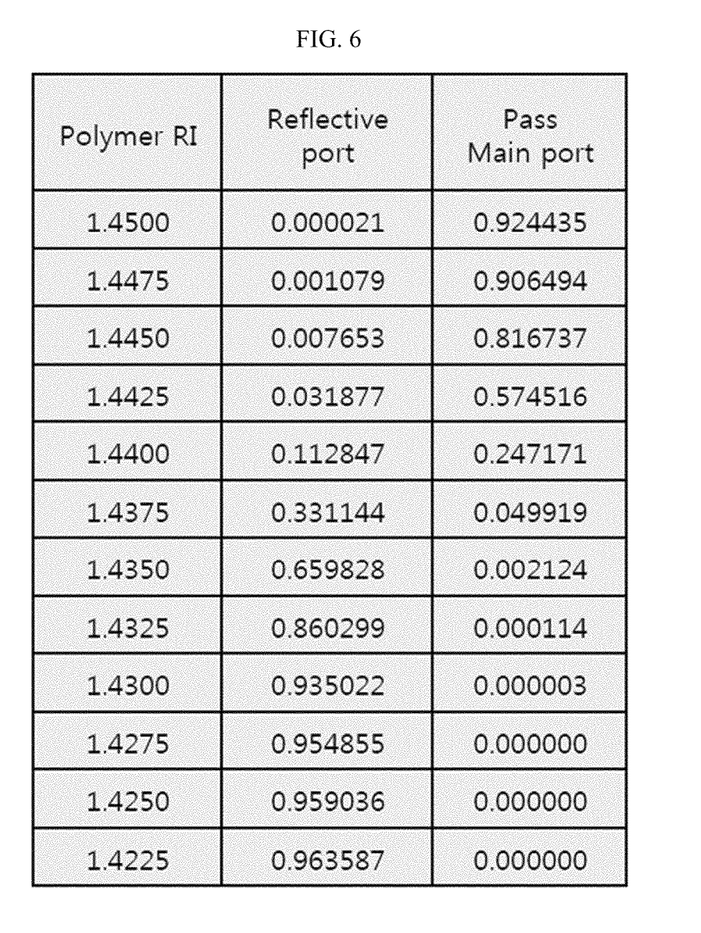
FIGS. 6 and 7 are views illustrating changes in output power according to refraction index changes according to the present invention.
Figure 7:
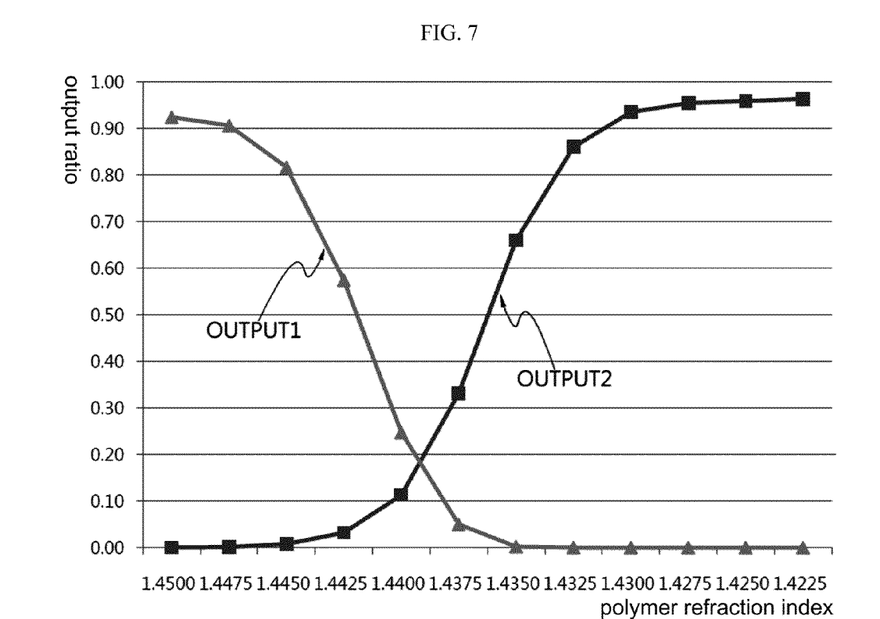

FIGS. 6 and 7 are views illustrating changes of output power according to changes of refraction indexes of the polymer of the present invention.

FIGS. 6 and 7 shows changes of optical signal power of the first and second output port (Pass Main port, Reflective port) (OUTPUT1, OUTPUT2) according to changes of refraction indexes (Polymer RI) of the polymer 130 inserted into the trench of the total reflection type optical switch 110.

In the graph of FIG. 7, the horizontal axis represents the reflective index (RI) of the polymer. The vertical axis represents the output ratio of an optical signal which is output when "1" is input as the size of the absolute value of the intensity of the optical signal. For example, '0.9' value means the output intensity of '90%' against the intensity of the optical signal.

Therefore, a total reflection type optical switch 100 of the present invention may adjust the refraction index of the polymer 130 to determine the optimal conditions under which a total reflection may occur in the polymer 130. For example, a refraction index of the polymer 130 is determined according to various conditions such as a difference of refraction indexes of the silica substrate 102 and silica clad 104, a cross section size of the silica optical waveguide (silica core) 110 caused by a single mode and multi mode, a heating temperature range of the heater 140, and an intensity of the output optical signal etc.

Figure 8:
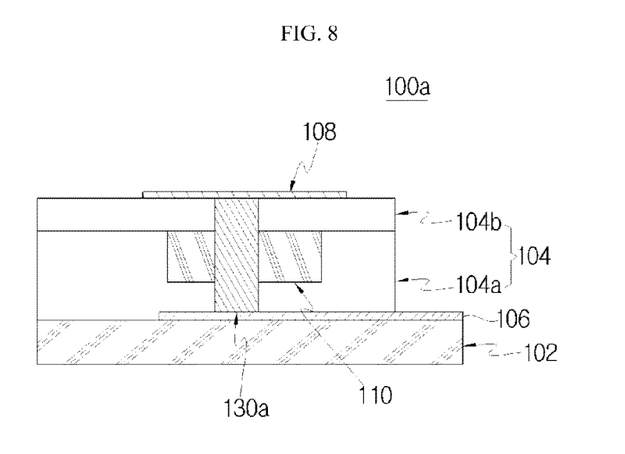
FIG. 8 is a cross-sectional view illustrating a configuration of a total reflection type optical switch according to another exemplary embodiment of the present disclosure.

FIG. 8 is a cross sectional view illustrating a configuration of a total reflection type optical switch according to another exemplary embodiment of the present invention. Herein, configurations and effects different from the total reflection type optical switch 100 of FIG. 1 are explained in detail, but detailed explanation on configurative elements have the same functions are omitted.

The total reflection type optical switch 100a of FIG. 8 has a structure of using an electric field instead of a heater. The total reflection type optical switch 100a forms a lower electrode 106 above a silica substrate 102. A silica clad 104, silica optical waveguide 110 and trend are formed above the lower electrode 106. An electric optic polymer 130a is inserted into the trench, and then a polling process is performed on the electric optic polymer. Next, an upper electrode 108 is formed in an upper side of the electric optic polymer 130a. Of course, the total reflection optical switch 100a may substitute a lower electrode 106 with a substrate which is capable of electricity conduction.

The upper and lower electrodes 106, 108 receive power and enables an electric field to be formed in the electric optic polymer 130a.

The electric optic polymer 130a processes the same functions as a thermo-optic polymer 130. That is, the electric optical polymer 130a is used as a switching member for converting an optic route of an optic signal input into the silica optical waveguide 110. In the electric optic-polymer 130a, a total reflection occurs as the refraction index changes when power is applied to the upper and lower electrodes 106, 108.

Therefore, the total reflection type optical switch 100a applies power to the upper and lower electrodes 106, 108 to adjust switching operations of the electric optic polymer 130a. Such a total reflection type optical switch 100a is capable of high speed switching of nano grade speed compared to the thermo-optic total reflection type optical switch 100 of FIG. 1. By this, it is possible to embody a high speed total reflection type optical switch 100a.

Not only that, the aforementioned total reflection type optical switch 100, 100a of the aforementioned present invention is not limited to uses of an optical switch. For example, the total reflection type optical switch 100, 100a of the present invention may be used as a variable optical attenuator (VOA) depending on adjustments of current or voltage applied to the heater 140 or upper and lower electrodes 106, 108.

Hereinbelow is detailed configurations and operations of a total reflection type 1×2 optical switch according to the preset invention with reference to FIGS. 9 and 10.

Figure 9:
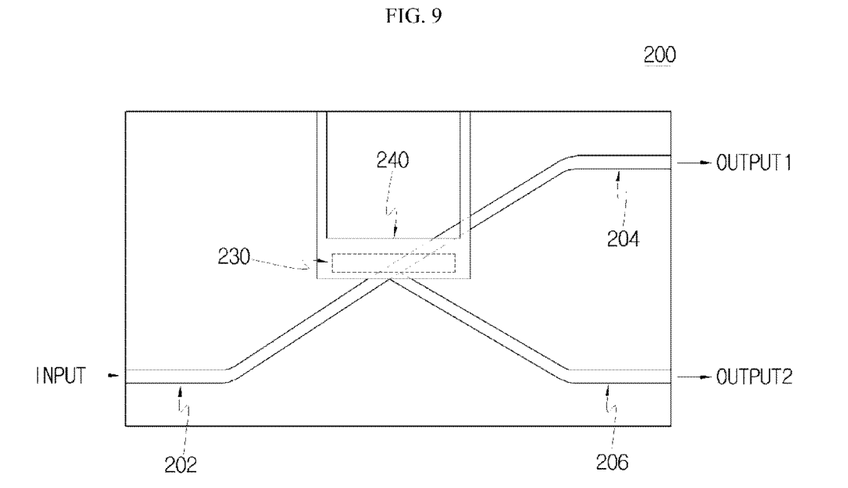
FIG. 9 is a view illustrating a configuration of a total reflection type 1×2 optical switch using a total reflection type optical switch structure of the present invention.
Figure 10A:
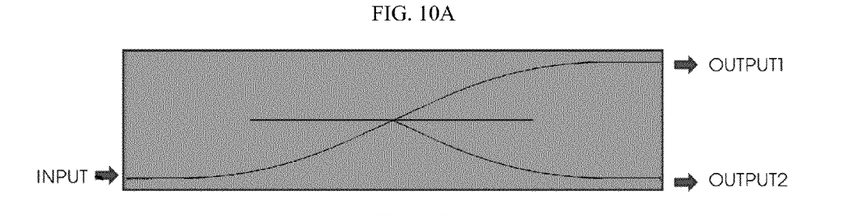
FIGS. 10A to 10C are views illustrating computer simulation results of a total reflection type 1×2 optical switch illustrated in FIG. 9.
Figure 10B:
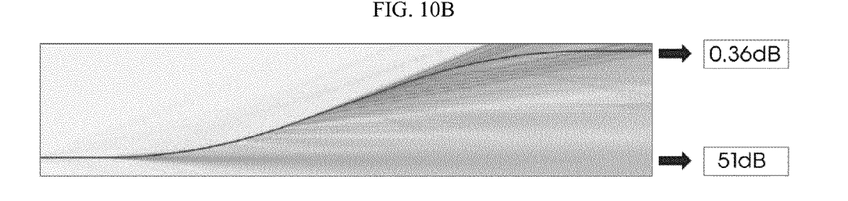
Figure 10C:
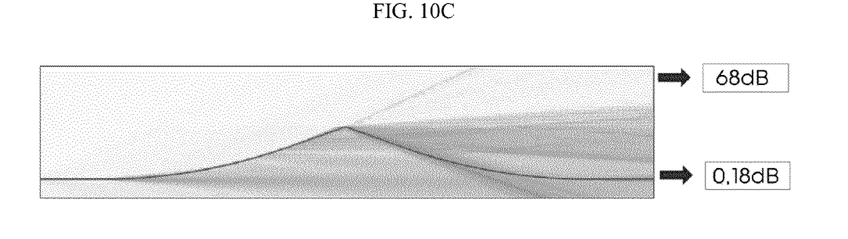

FIG. 9 is a view illustrating a configuration of a total reflection type 1×2 optical switch using the total reflection type optical switch structure of the present invention, and FIGS. 10A to 10C are views illustrating computer simulation results of the total reflection type 1×2 optical switch illustrated in FIG. 9.

With reference to FIG. 9, the total reflection type 1×2 optical switch 200 is an integrated optical device module having a structure of a thermo-optic total reflection type optical switch 100. The total reflection type 1×2 optical switch 200 includes one silica input optical waveguide 202 connected to an input port and first and second silica output optical waveguides 204, 206 each connected to a first and second output port (OUTPUT1, OUTPUT2), respectively. In addition, the total reflection type 1×2 optical switch 200 includes a switching member 230 installed in the intersection of the silica optical waveguides 202~206, and a heater 240 which is arranged in an upper side of the switching member 230 and heats the switching member 230. The switching member 230 is made of thermo-optic polymer or electric optic polymer.

With reference FIGS. 10A to 10C, the computer simulation results of the present exemplary embodiment illustrates the total reflection type 1×1 optical switch 200 being operated when the size of the refraction index of the polymer 230 has been changed by 0.0015 in a single mode silica optical waveguide 202~206 having a difference of 0.4% refraction index.

Therefore, as illustrated in FIG. 10B, the total reflection type 1×2 optical switch 200 transilluminates an optical signal input into the silica input optical waveguide 202 in the polymer 230 at an off state where power is not applied to the heater 240. Accordingly, the optical signal is output to the first silica output optical waveguide 204 (OUTPUT1).

In addition, the total reflection type 1×2 optical switch 200 totally reflects the optical signal input into the silica input optical waveguide 202 as illustrated in FIG. 10C at an on state where power is applied to the heater 240. Accordingly, the optical signal is output to the second silica output optical waveguide 206 (OUTPUT2).

As another exemplary embodiment, the total reflection type 1×2 optical switch 200 may have a structure of an electric optical total reflection type optical switch 100a. Such a total reflection type 1×2 optical switch 200 uses an electric field to adjust the switch operations of the polymer 130a. Accordingly, a high speed switching is possible The total reflection type 1×2 optical switch 200 of the present invention inserts the thermo-optic or electric-optic polymer 130 or 130a into the intersection of the silica optical waveguides. In addition, the total reflection type 1×2 optical switch 200 of the present invention adjust the current and voltage of power applied to the heater 140 or electrodes 106, 108. Accordingly, the total reflection type 1×2 optical switch 200 could also be used as a variable optical attenuator (VOA) which adjusts the intensity of an optical signal.

FIGS. 11A to 11E are views illustrating a method of manufacturing a total reflection type optical switch according to the present invention. In the present exemplary embodiments a method of manufacturing a total reflection type optical switch using thermo-optic polymer is explained hereinbelow.

Figure 11A:
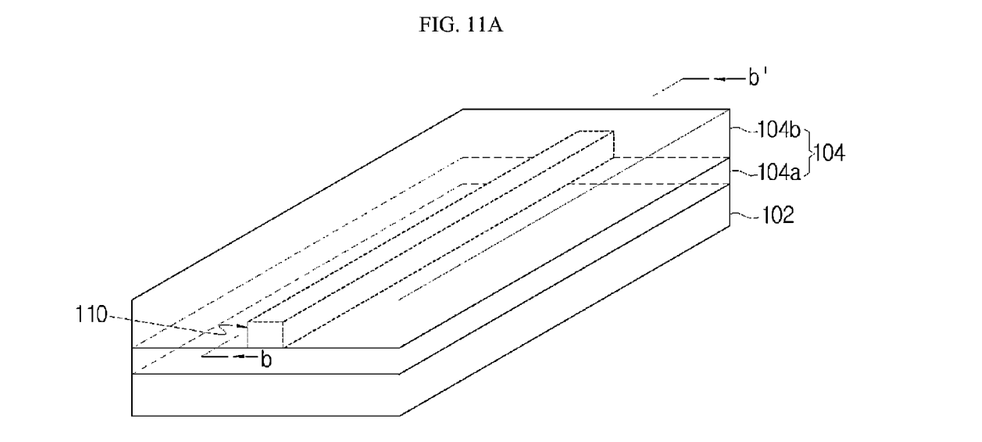
FIGS. 11A to 11E are views illustrating a manufacturing process of a total reflection type optical switch according to the present invention.

With reference to FIG. 11A, the total reflection type optical switch 100 uses a general silica optical waveguide manufacturing process of a planar lightwave circuit. That is, on a silica substrate 102, a lower clad 104a is deposited. On the deposited lower clad 104a, a silica core 110 where different optical waveguides intersect one another is formed. On an upper part of the lower clad 104a where the silica core 110 is formed, an upper clad 104b is deposited.

Figure 11B:
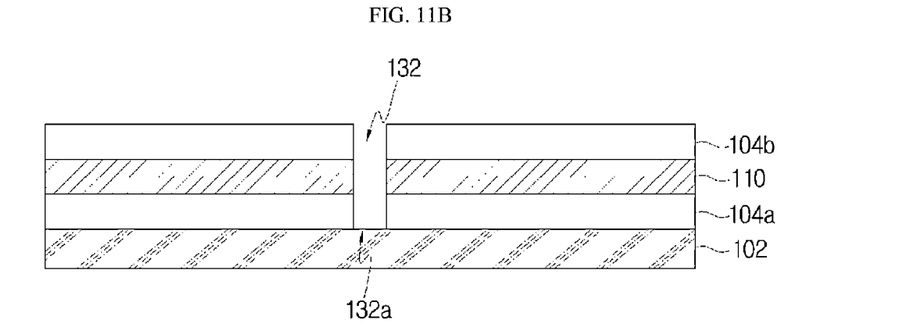

With reference to FIG. 11B, a trench 132 is formed on the silica substrate 102 where the lower clad 104a, silica core 110 and upper clad 104b are deposited. The trench 132 is formed perpendicularly penetrating the upper clad 104b, silica core 110 and lower clad 104a. The trench 132 is formed using an etching process, photolithography process or dicing process. Herein, the trench 132 has a downward depth than the silica core 110. That is, the bottom surface 132a of the trench 132 is located between the upper part of the silica substrate 102 and the lower part of the silica core 110. For example, when the total reflection type optical switch 100 uses the thermo-optic polymer 130, the trench 132 is formed such that the bottom surface 132a is located between the silica substrate 102 and the silica core 110. When the total reflection type optical switch 100 uses the electric-optic polymer 103a, the trench 132 is formed such that the bottom surface 132a contacts the upper surface of the silica substrate 102.

Figure 11C:
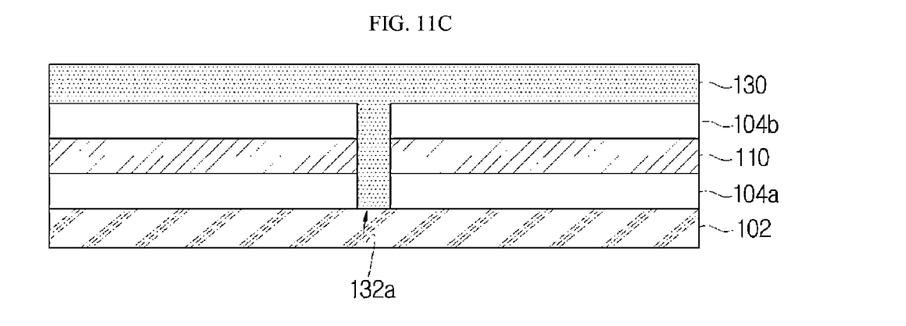
Figure 11D:
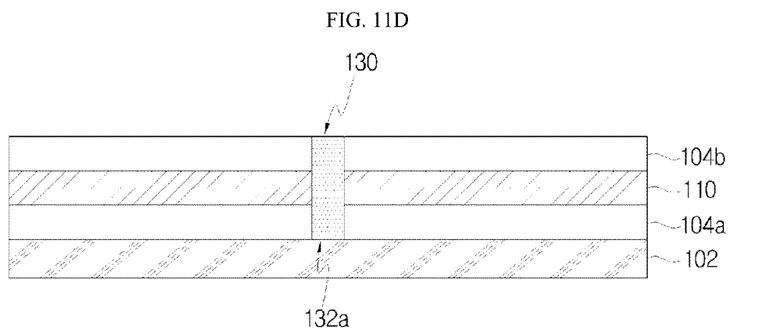
Figure 11E:
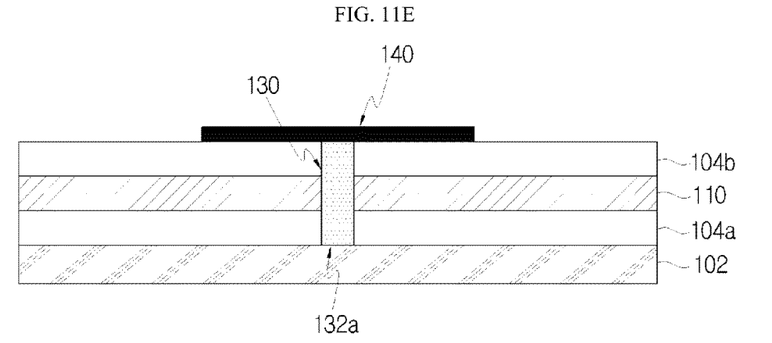

As illustrated in FIGS. 11C to 11D, on the upper part where the trench 132 is formed, polymer 130 is coated and filled in the trench 132. The polymer 130 is provided as material having a negative thermo-optic coefficient using a spin coating process or blade coating process etc. In addition, regarding the refraction index of the polymer 130, a thermo-optic coefficient is calculated and applied in accordance with the usable temperature. Next, the polymer 130 of the upper part is removed using an abrasion process or plasma etching process etc. Herein, the polymer 130 of the upper part is removed such that the upper clad 104b is exposed. Next, as illustrated in FIG. 11E, at a top end of the polymer 130 inserted into the trench 132, a metal heater 140 is formed using a patterning process etc.

As another exemplary embodiment, a method of manufacturing a total reflection type optical switch 100a using an electric-optic polymer 130a is as follows. As illustrated in FIG. 8, before the lower clad 104a is deposited on the silica substrate 102, a lower electrode 106 is formed. Next, the trench 132 is formed by depositing the lower clad 104a, silica core 110 and upper clad 104b sequentially. After the polymer 130a is inserted into the trench 132, the polymer 130a is polled so as to induce the electric-optic effect. Next, an upper electrode 108 is formed on the upper part of the polymer 130a which has been polled. Of course, a substrate where electrical conduction is possible may substitute for the lower electrode 106.

As aforementioned, the total reflection type optical switch 100 or 100a of the present invention inserts a thermo-optic or electric-optic polymer 130 or 130a into the intersecting location of the silica optical waveguide 110 where different optic routes intersect one another. Accordingly, the total reflection type optical switch 100 or 100a transilluminates or totally reflects an optical signal due to the difference of refraction indexes between the silica optical waveguide 110 and polymer 130 or 130a.

Hereinbelow is explanation on another exemplary embodiment with reference to FIGS. 12 to 16.

Figure 12:
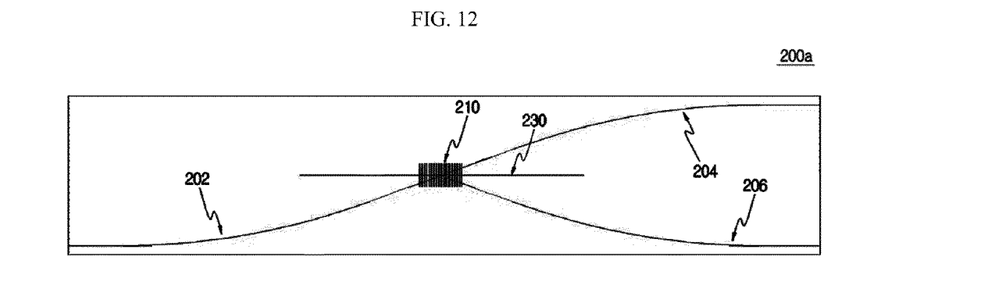
FIGS. 12 and 13 are views illustrating a configuration of a total reflection type 1×2 optical switch using a total reflection type optical switch structure according to another exemplary embodiment of the present invention.
Figure 13:
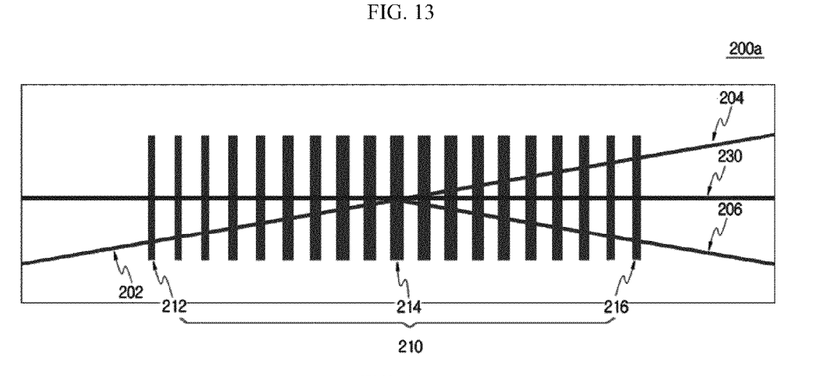
Figure 14A:
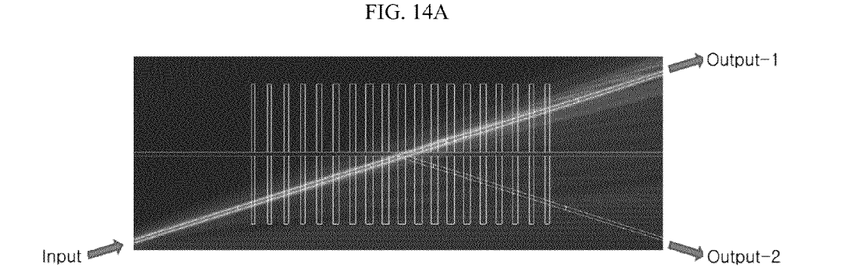
FIGS. 14A and 14B are views illustrating computer simulation results of a total reflection type 1×2 optical switch illustrated in FIG. 12.
Figure 14B:
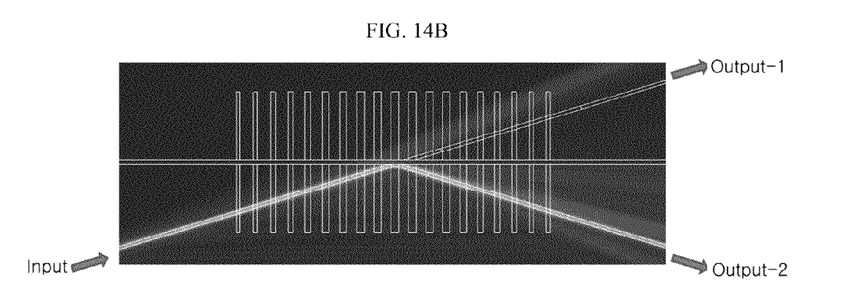
Figure 15:
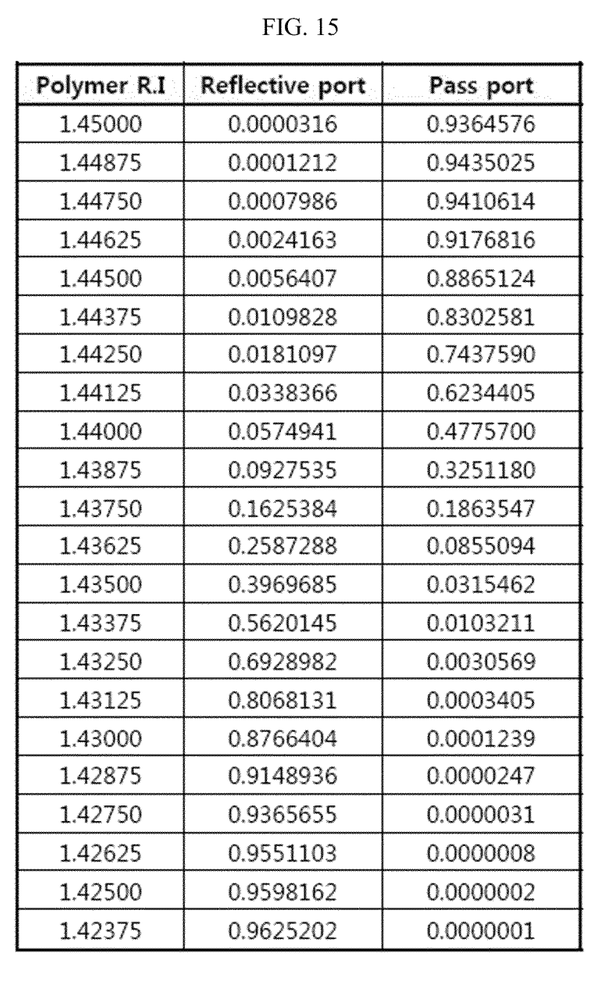
FIGS. 15 and 16 are views illustrating changes in refraction index and output power of a polymer in a total reflection type 1×2 optical switch illustrated in FIG. 12.
Figure 16:
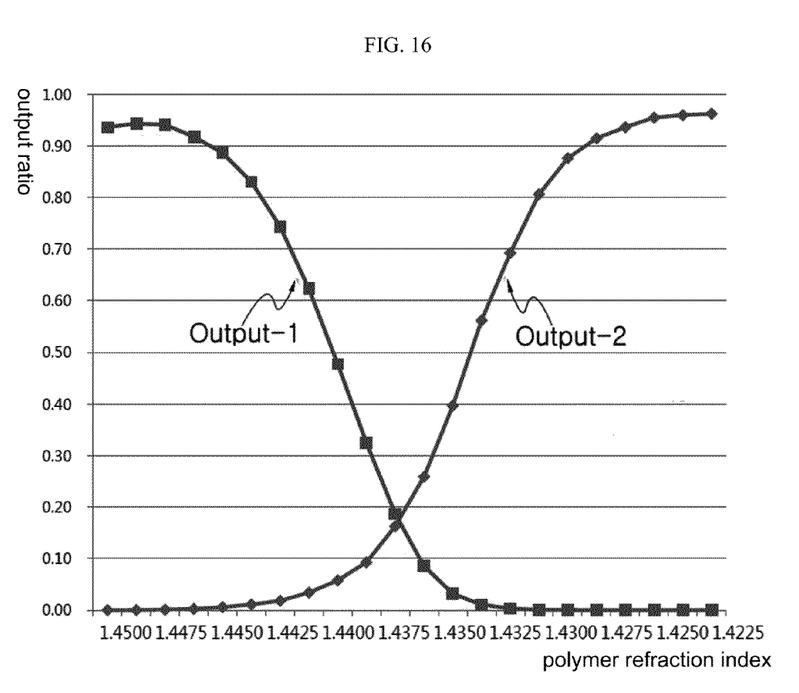

FIGS. 12 and 13 are views illustrating a configuration of a total reflection type 1×2 optical switch using the total reflection type optical switch structure according to another exemplary embodiment of the present invention. FIGS. 14A and 14B are views illustrating computer simulation results of the total reflection type 1×2 optical switch illustrated in FIGS. 14A and 14B. FIGS. 15 and 16 are views illustrating changes refraction indexes of polymer and changes in output power in the total reflection type 1×2 optical switch illustrated in FIGS. 15 and 16. Herein, the configuration different from the total reflection optical switch 200 of FIGS. 9 and 10 is explained in detail, whereas configurative elements of the same functions will be omitted.

First of all, the total reflection type 1×2 optical switch 200a of FIGS. 12 and 13 has a polymer insertion type silica optical waveguide structure according to the present invention.

The total reflection type 1×2 optical switch 200a forms a single mode based silica optical waveguide 202~206. The silica optical waveguides 202~206 include first and second silica optical waveguides 202~206 which intersect each other, and a plurality of third optical waveguides 201:212~216 which divaricate from the first and second silica optical waveguides 202~206.

More specifically, a plurality of third silica optical waveguides 210 are formed in a location where the first and second silica optical waveguides 202~206 intersect each other. The third silica optical waveguides 210 divaricate in a direction which is generally not parallel with the proceeding direction of an optical signal input into the first silica optical waveguides 202, 204 in a location where the first and second silica optical waveguides 202~206 intersect each other. For example, the third silica optical waveguides 210 divaricate generally perpendicularly in a longitudinal direction of the switching member, that is the polymer 230.

In addition, the third silica optical waveguides 210 maintain a certain distance from one another. The third silica optical waveguides 210 have a structure of being arranged symmetrically in both directions of the input port and output port within a certain range around the intersection location.

Furthermore, as the third optical waveguides 210:212~216 go towards both directions from the intersecting location, the width gets smaller. That is, the third silica optical waveguides 212, 216 arranged in the input out port sides have smaller widths than the third silica optical waveguides 214 arranged in the intersecting location. For example, the third silica optical waveguides 210:212~216 are arranged to have widths in approximately 10~50 μm range in the intersecting location. Herein, the reason for limiting the widths of the third silica optical waveguides 210 is because their characteristics are weak in the widths less than approximately 10 μm. Meanwhile, if the widths exceed approximately 50 μm, the wider portion of the widths in the optical waveguides direction gets longer, and thus a multi mode may occur. When an extreme multi mode occurs, problems may occur such as increase of optical loss.

When the total reflection type 1×2 optical switch 200a passes the polymer area inserted into the location where the optical signals are entered into the input port by the third silica optical waveguides 210:212~216, it is possible to prevent dispersion of the optical signals, thereby preventing a little loss thereof.

In addition, the total reflection type 1×2 optical switch 200a gradually increases the widths of the third silica optical waveguides 210:212~216 from the input port side to the intersection location, and decreases the widths from the intersecting location to the output port side. Accordingly, it is possible to minimize optical loss during optical transmission and provide stability.

Furthermore, when the total reflection type 1×2 optical switch 200a is applied to an optical communication device, an input and output port are separated. Accordingly, the total reflection type 1×2 optical switches 210 are embodied in a symmetrical structure around the intersecting location.

Therefore, the total reflection type 1×2 optical switch 200a uses the third silica optical waveguides 210 to prevent optical loss in the optical waveguide mode. Accordingly, it is possible to improve the characteristics of the optical waveguide mode of the first and second silica optical waveguides 202~206 than the total reflection type 1×2 optical switch 200 of FIG. 9, thereby improving the optical switch functions. As illustrated in FIG. 16, the total reflection type 1×2 optical switch 200a has an advantage of approximately 2% of optical transmission loss than the structure of the total reflection type 1×2 optical switch 200 illustrated in FIGS. 9 and 10.

In addition, as illustrated in FIG. 15, the total reflection type optical switch 200a may adjust the optical signal power of the first and second output port (Pass port, Reflective port) (OUTPUT-1, OUTPUT-2) due to changes of refraction indexes of the polymer 230 (Polymer RI). Therefore, the total reflection type optical switch 200a may adjust the refraction indexes of the polymer 230 to determine the optimal condition for enabling a total reflection in the polymer 230.

With reference to FIGS. 14A to 14B, all computing simulations of this exemplary embodiment are measured under the same conditions as the computer simulations of FIG. 10. That is, it indicates operation of the total reflection type 1×1 optical switch 200 when the refraction index of the polymer 230 is changed by a size of 0.0015 in single mode silica optical waveguides 202~206 having a difference of a refraction index of 0.4%.

Therefore, as illustrated in FIG. 14A, the total reflection type 1×2 optical switch 200a transilluminates an optical signal input into the input port (INPUT) in the polymer 230 at an off state where power is not applied to the heater (240 of FIG. 9) or the upper electrodes (106 and 108 of FIG. 8). Accordingly, the optical signal is transmitted to the second output port (OUTPUT 2).

Hereinabove was explanation on the configuration and functions of a total reflection type optical switch of the present invention according to the detailed description and figures. These are mere explanation according to embodiments, and thus, various changes and modifications will be possible.

What is claimed is:

1. A total reflection type optical switch comprising:
   silica optical waveguides having first silica optical waveguides which are formed on a substrate and connect an input port and a first output port, and second silica optical waveguides which intersect the first silica optical waveguides and are connected to a second output port; and
   a polymer which is provided in a intersecting location where the first and second silica optical waveguides intersect each other and which switches an optical signal input into the input port to be output to the first output port or second output port;
   wherein the silica optical waveguides further comprise a plurality of third silica optical waveguides which are provided generally perpendicularly in a longitudinal direction of the polymer and arranged parallel to each other along the longitudinal direction.

2. The total reflection type optical switch according to claim 1,
   wherein the plurality of third silica optical waveguides are arranged to be spaced apart from one another by a predetermined distance.

3. The total reflection type optical switch according to claim 1,
   wherein the plurality of third silica optical waveguides have widths which decrease away from the intersecting location.

4. The total reflection type optical switch according to claim 3,
   wherein the plurality of third silica optical waveguides are symmetric with respect to the intersection location.

5. The total reflection type optical switch according to claim 1,
   wherein the polymer has a negative thermo-optic coefficient value.

6. The total reflection type optical switch according to claim 1,
   wherein the polymer has the same refraction index as a core of silica optical waveguides.

7. The total reflection type optical switch according to claim 1,
   further comprising a heater which heats the polymer,
   wherein the polymer is a thermo-optic polymer and a refraction index of the thermo-optic polymer changes when the thermo-optic polymer is heated by the heater.

8. The total reflection type optical switch according to claim 7, wherein the polymer transilluminates the optical signal to the first output port, or totally reflects the optical signal to the second output port when the polymer is heated by the heater.

9. The total reflection type optical switch according to claim 1,
further comprising upper and lower electrodes which form an electric field in the polymer,
wherein the polymer is an electric-optic polymer and a refraction index of the electric-optic polymer changes by the electric field.

10. The total reflection type optical switch according to claim 9,
wherein the polymer transilluminates the optical signal to the first output port, or totally reflects the optical signal to the second output port when the electric field is formed.

11. A method of manufacturing a total reflection type topical switch, the method comprising:
depositing a lower clad on a silica substrate;
forming a silica core on the lower clad, wherein the silica core includes a first silica core which forms a first optic route; a second silica core which intersects the first silica core and forms a second optic route; and a plurality of third silica cores which are arranged parallel to each other around an intersecting location where the first and second silica cores intersect and which are not in parallel with the first silica core;
depositing an upper clad on the lower clad where the silica core is formed;
forming a trench to perpendicularly penetrate the silica core of the intersection location from the upper clad; and
inserting a polymer into the trench.

12. The method according to claim 11,
wherein the plurality of third silica cores are arranged to be spaced apart from one another by a predetermined distance.

13. The method according to claim 11,
wherein the plurality of third silica optical cores have widths which decrease away from the intersecting location.

14. The method according to claim 13,
wherein the plurality of third silica optical cores are symmetric with respect to the intersection location.

15. The method according to claim 11,
further comprising forming a heater on an upper part of the polymer,
wherein the polymer is made of thermo-optic polymer material a refraction index of which is changed by heat.

16. The method according to claim 15,
wherein the polymer transilluminates an optical signal input into the first optic route, or totally reflects an optical signal input into the first optic route to the second optic route when the polymer is heated by the heater.

17. The method according to claim 15,
wherein the trench is formed such that a bottom surface of the trench is located between the substrate and the silica core.

18. The method according to claim 11,
further comprising upper and lower electrodes which form an electric field in the polymer,
wherein the polymer is made of an electric-optic polymer material a refraction index of which is changed by the electric field.

19. The method according to claim 18,
wherein the polymer transilluminates an optical signal input into the first optic route, or totally reflects an optical signal input into the first optic route to the second optic route when the electric field is formed.

20. The method according to claim 18,
wherein the trench is formed such that a bottom surface of the trench contacts an upper surface of the substrate.

* * * * *